(12) United States Patent
Pedenon

(10) Patent No.: US 7,143,020 B1
(45) Date of Patent: Nov. 28, 2006

(54) METHOD AND SYSTEM FOR GENERIC INFERENCE OF SEQUENTIAL ELEMENTS

(75) Inventor: Arnaud Pedenon, Juan-les-pins (FR)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 09/415,018

(22) Filed: Oct. 7, 1999

(51) Int. Cl.
G06F 17/50 (2006.01)

(52) U.S. Cl. .................. 703/14; 703/1; 703/13; 703/15; 716/1; 716/2; 716/3; 707/104; 707/101; 707/102

(58) Field of Classification Search .............. 716/1–7, 716/9; 703/2, 4, 13–15; 707/100–104
See application file for complete search history.

(56) References Cited

U.S. PATENT DOCUMENTS

| | | | |
|---|---|---|---|
| 5,359,539 A | | 10/1994 | Matsumoto et al. |
| 5,491,640 A | | 2/1996 | Sharma et al. |
| 5,991,524 A | * | 11/1999 | Belkhale et al. .............. 716/18 |
| 6,023,566 A | * | 2/2000 | Belkhale et al. ............... 716/2 |
| 6,088,519 A | * | 7/2000 | Koford .......................... 716/2 |
| 6,272,664 B1 | * | 8/2001 | Chang et al. ................. 703/2 |
| 6,415,425 B1 | * | 7/2002 | Chaudhary et al. ........... 716/10 |
| 6,519,609 B1 | * | 2/2003 | Touzet ..................... 707/104.1 |
| 6,665,844 B1 | * | 12/2003 | Stanion ......................... 716/5 |
| 7,009,421 B1 | * | 3/2006 | Pugh et al. .................... 326/38 |

2002/0157063 A1* 10/2002 Besson ........................ 716/1

OTHER PUBLICATIONS

"Formal Verification In hardware Design" C. Kern, ACM 1084-4309/99/0400, 1999.*
"Boolean matching for large libraries", Hinsberger et al, DAC 98', ACM 1998.*
Olivier Touzet, "EpsSeqOpt: optimization of sequential elements for Epsilon (Functional Specification) Revision 1.8", EpsCellServer: A Library Cell Service for Epsilon, Cadence Design Systems, Inc., Aug. 10, 1998, pp. 1-80.
Shankar Krishnamoorthy et al., "Boolean matching of sequential elements", 31st ACM/IEEE Design Automation Conference, 1994, pp. 691-697.
Chaudhuri S. et al., "Synthesis using Sequential Functional Modules (SFMs)," Computer-Aided Design, 19996, ICAD-96. Digest of Technical Papers., 1996 IEEE/ACM International Conference On San Jose, CA, USA, Nov. 10-14, 1996, Los Alamitos, CA, USA, IEEE Comput. Soc., US, pp. 436-441.

* cited by examiner

Primary Examiner—Fred Ferris
(74) Attorney, Agent, or Firm—John Carpenter; Reed Smith, LLP (57) ABSTRACT

A method for inferring a requested data input function of a sequential cell from a library of candidate cells, wherein the requested cell and the candidate cell are expressed as polynoms and then divided. The method generates polynomial expressions of the inhibition, transformation and inference steps necessary to convert the candidate cell into the requested cell. The use of polynomial expression and division greatly reduces the number of rules necessary to accommodate the varying combinations of requested cell and candidate cell functions.

28 Claims, 7 Drawing Sheets

| Inhibition | |
| --- | --- |
| Rst | inhib a Reset active high |
| RstLr | inhib a Reset active low |
| St | inhib a Set active high |
| StLs | inhib a Set active low |
| ScStRst | inhib a Scan active high |
| ScStLsRstLc | inhib a Scan active low |
| MuScStRst | inhib a Mux |
| Re | inhib a Recirculating active high |
| ReLre | inhib a Recirculating active low |
| T | stop proces, impossible to inhib a Toggle element |

FIG. 5

|  | Transformation |
|---|---|
| rule 1 | 1: Do nothing |
| rule 2 | Ls or Ls^-1: Add an inverter on the Reset terminal |
| rule 3 | Lr or Lr^-1: Add an inverter on the Set terminal |
| rule 4 | Lre or Lre^-1: Add an inverter on the Recirculating enable |
| rule 5 | LrLs or (LrLs)^-1: Add an inverter on the Scan enable |
| rule 6 | ScSt: set TI to Vss and connect TE to Reset terminal |
| rule 7 | ScRst: set TI to Vss and connect TE to Set terminal |
| rule 8 | ScRst(Ls^-1): set TI to Vdd and connect TE to set terminal with an inverter |
| rule 9 | ScSt(Lr^-1): set TI to Vss and connect TE to reset terminal with an inverter |
| rule 10 | ScStLrLs: set TI to Vss and connect TE to reset terminal with an inverter |
| rule 11 | ScRstLrLs: set TI to Vdd and connect TE to set terminal with an inverter |
| rule 12 | ScRstLr: set TI to Vdd and connect TE to set terminal |
| rule 13 | ScStLs: set TI to Vss and connect TE to reset terminal |
| rule 14 | Mu: connect D1 to TI and connect SEL to TE terminal |
| rule 15 | Mu(LrLs)^-01: connect D0 to TI and connect SEL to TE terminal |
| rule 16 | MuScSt: set D1 to Vss and connect SEL to Reset terminal |
| rule 17 | MuScRst: set D1 to Vdd and connect SEL to set terminal |
| rule 18 | MuScRst(Ls^-1): set D0 to Vdd and connect SEL to set terminal |
| rule 19 | MuScSt(Lr^-1): set D0 to Vss and connect SEL to set terminal |
| rule 20 | Mu^-1): connect D1 to TI, SEL to TE |
| rule 21 | (Mu^-1)LsLr: connect D0 to TI, SEL to TE |

FIG. 6

|  | Inference |
|---|---|
| Rst | infer a Reset active high |
| RstLr | infer a Reset active low |
| St | infer a Set active high |
| StLs | infer a Set active low |
| ScStRst | infer a Scan active high |
| ScStLsRstLr | infer a Scan active low |
| MuScStRst | infer a Mux |
| Re | infer a Recirculating active high |
| ReLre | infer a Recirculating active low |
| T | infer a Toggle element |

FIG. 7

| row/column | Rst | RstLR | St | StLs | ScStRst | ScStLsRstLr | MuScStRst | Re | ReLre | T |
|---|---|---|---|---|---|---|---|---|---|---|
| Rst | T1 | T2 | --- | --- | --- | --- | --- | --- | --- | --- |
| RstLr | T2 | T1 | --- | --- | --- | --- | --- | --- | --- | --- |
| St | --- | --- | T1 | T3 | --- | --- | --- | --- | --- | --- |
| StLs | --- | --- | T3 | T1 | --- | --- | --- | --- | --- | --- |
| ScStRst | T6 | T9 | T7 | T8 | T1 | T5 | T20 | --- | --- | --- |
| ScStLsRstLr | T10 | T13 | T11 | T12 | T5 | T1 | T21 | --- | --- | --- |
| MuScStRst | T16 | T19 | T17 | T18 | T14 | T15 | T1 | --- | --- | --- |
| Re | --- | --- | --- | --- | --- | --- | --- | T1 | T4 | --- |
| ReLre | --- | --- | --- | --- | --- | --- | --- | T4 | T1 | --- |
| T | --- | --- | --- | --- | --- | --- | --- | --- | --- | T1 |

//  # METHOD AND SYSTEM FOR GENERIC INFERENCE OF SEQUENTIAL ELEMENTS

BACKGROUND OF THE INVENTION

1. Field of the Invention

The invention relates generally to the field of electronic design automation (EDA), and particularly to a system and method for generically inferring sequential logic elements to generate a netlist for the desired circuit.

2. Description of the Related Field

EDA generally refers to a powerful process that allows designers to describe a desired digital circuit on an abstract, functional level, the Register Transfer Level (RTL) using Hardware Description Language (HDL). The functionality of the design can then be verified mathematically through circuit simulation. Logic synthesis automatically converts the RTL description to a gate-level netlist. Subsequent steps parse the netlist to place the gates on the chip floor. Finally, a routing process determines the physical layout necessary to create the requisite connections between the gates. From the physical layout, the silicon for the resulting integrated circuit can be fabricated.

The logic synthesis step requires both the RTL expression of the desired circuit as well as a library of predefined sequential cells, or blocks of logic functionality. A sequential inferrer assembles sequential cells into a netlist of interconnected cells that have the functionality of the RTL description. Specifically, a sequential cell server provides the process with the specific cells necessary to achieve the desired functionality. The server either obtains the requested cell directly from the library or, more significantly, it generates the requested cell by combining one or more functions from the basic cells in the library. When an inferred cell is necessary, the cell server compares the component parts of the requested cell against the library of available cells. The cells can be broken down into output portions, input portions, clock portions, and asynchronous portions. Candidate cells are selected from the library that match the output, clock and asynchronous portions of the requested cell. Then, the server determines whether each candidate cell's input function can be transformed via inhibition, transformation or combinational inference to match that of the requested cell. When an appropriate candidate is selected, the cell can be transformed and incorporated into the netlist. Typically, more than one candidate cell can be transformed to achieve the desired functionality. Therefore, the successful candidate cells can be further screened to optimize other necessary criteria such as size, power consumption, signal integrity, routing constraints and the like.

An example of prior art logic synthesis involves the use of full rule-based transformation. As discussed above, the transformation process focuses on the data input portion of a sequential cell. Data input functions lie between the data input terminals and the clock mediated flipflop or latch. Thus, for the purposes of this invention, data input functions are always synchronous and the functions comprise the set of combinational elements that operate on the data input. These elements can either be simply a wire or a gate, including an AND gate (for a reset function), an OR gate (for a set function), a multiplexer ("MUX"—for selecting), or an inverter (to toggle). The elements are assigned a position based on their relation between the data input and the flipflop such that the closest element to the flipflop is the first position.

The nature of the elements allows some reduction in the possibility of combinations. For example, the Toggle and MUX elements have forbidden positions (they must be set in the last position of the function), and the Toggle and MUX elements are mutually exclusive (they cannot be present in the same function). It is possible to simplify the process somewhat by constraining the number of elements that may be used. For example, allowing each element to be inferred only once results in 258 possible combinations without either a MUX or Toggle element, 258 combinations with a Toggle element and 170 combinations with a MUX element, for a total of 686 different functions. Accommodating each of these possible combinations with a full rule-based mechanism requires a total of 470,596 transformation rules (686 possible requested cells multiplied by 686 possible candidate cells). Allowing the elements to appear more than once exacerbates the problem. For example, allowing up to five positions results in more than 3000 functions and correspondingly requires more than one million rules. As exemplified below, this available system can accommodate simple transformations, but more complex functions illustrate the limitations of the system.

In a first example, the requested cell has a data input function of Reset active high. To apply the full rule-based system, each candidate is screened to determine if it has a Reset element. If so, then the inferrer must confirm the polarity on the synchronous reset terminal and inhibit (replace with a simple connection) any other elements, such as Scan, ScanMux or Set. If the candidate does not contain a Reset element, then a Scan element can be set to a constant to transform it, the MUX and Set elements can be inhibited, or if no Scan is present a synchronous Reset can be inferred. Since only a few rules are necessary for this example, the rule based transformation can be adequate for relatively simple functions such as Set, Reset or Scan.

A requested cell having an active high synchronous Set Reset function presents a more complicated example. For a simple flipflop candidate cell, the full rule based system requires the addition of appropriate AND and OR gates. If the candidate is an active low Scan flipflop, the active low Scan must be transformed into a Reset and an OR gate must be added. On the other hand, if the candidate is an active high ScanMux flipflop, the active high Scan is transformed into a Reset and the MUX is transformed into Set. Finally, if the candidate is an active high Reset high recirculating flipflop, the Reset is kept, the recirculating element is inhibited and an OR gate is added. This example demonstrates that a specific rule is required for each type of candidate cell depending on parameters such as whether a Scan or ScanMux is available. Accordingly, the number of possible combinations discussed above indicates that the full rule-based system is essentially unmanageable for more sophisticated data input functions such as the Scan Set Reset function.

Another prior art sequential inferrer utilizes a Boolean matching system. In S. Krishnamoorthy, F. Maihlot "Boolean matching of sequential elements", 31st *Design Automation Conference*, 1994, the sequential cells are analogized to boolean expressions allowing the requested cell to be screened against the library. This teaching is hereby incorporated in its entirety by reference thereto for its disclosure of sequential inference and logic synthesis. However, this system works only if the requested cell finds an exact match in the library. It does not provide a means for transforming the basic cells of the library into requested cells that do not match. Further, the system does not maximize the number of candidates since only matches are identified, not candidates that could be transformed into matches. As discussed above, it is important to identify as many candidates as possible to permit optimization of other criteria.

Thus, there is a need for a sequential inferrer having a cell server capable of efficiently identifying candidate cells that may be transformed into a requested cell. There is also a need for an inferrer capable of transforming sophisticated logic functions and cells comprising multiple elements. Similarly, there is a need for an inferrer that maximizes the number of suitable candidate cells from a given library. Additionally, there is a need for a sequential inferrer that permits accurate cost estimation of the resulting circuit. There is also a need for an inferrer that uses a minimum number of rules to accommodate the various transformations necessary to convert a candidate cell into a requested cell. This invention satisfies these and other needs.

SUMMARY OF THE INVENTION

The present invention comprises a method for inferring a requested cell from a library of candidate cells during the generation of a netlist from the RTL description of a circuit. The method generally comprises representing the requested cell and the candidate cell as a mathematical expressions; performing an operation on the requested cell representation with the candidate cell representation to return at least one value; providing a rule corresponding to each returned value; and transforming the candidate cell into the requested cell by performing each rule corresponding to each returned value.

Preferably, the candidate cell and requested cell are expressed as polynomials comprising multinoms representing the functional synchronous elements. Further, division of the requested cell polynomial by the candidate cell polynomial returns inhibition, transformation and inference polynomials. A rule corresponding to each multinom of the inhibition, transformation and inference polynomials is then applied to the candidate cell to give it the functionality of the requested cell.

The multinoms from which the polynomial expression of the invention are derived may be classified as either major or minor, where a minor monom can divide 1 but a major monom cannot. A given polynomial representation is divisible by another if all the major monoms present in the divisor are also present in the dividend.

A table of rules for all the possible values of the inhibition, transformation and inference polynomials can easily be determined. Generally, the number of rules required is very manageable and represents a significant advantage over available systems that employ a full-rule based inference process. Preferably, the method is implemented in a computer to facilitate the EDA process.

BRIEF DESCRIPTION OF THE DRAWINGS

The aforementioned advantages of the invention, as well as additional advantages thereof, will be more fully understood as a result of a detailed description of a preferred embodiment when taken in conjunction with the accompanying drawings in which.

DETAILED DESCRIPTION OF THE INVENTION

Definitions

Sequential cell—a flipflop or latch having one or more synchronous functions interposed between the data input terminals and the flipflop or latch and may also comprise asynchronous functions;

Data input portion—the set of sequential cell terminals connected to functions controlled by the clock, i.e. the synchronous functions;

Asynchronous portion—the set of sequential cell terminals connected to functions not controlled by the clock and having immediate effect on the outputs, such as clear and preset;

Output portion—the set of sequential cell terminals that return the values produced by the synchronous functions and stored in the flipflop, such as Q, Qbar and Qz;

Clock portion—the cell input terminals carrying the clock signal to trigger the flipflop, such as Clock and ClockEnable;

Element—a synchronous subfunction, including Set, Reset, Mux, Scan, Recirc, and Toggle, implemented with AND, OR, MUX or INV;

Function—one or more elements connected to the data input terminals that provide the requested functionality;

Position—the order of connections of elements between the data input terminals and the flipflop, wherein the element adjacent the flipflop has the first position;

Library—an existing set of sequential cells directly available for the inference process;

Requested cell—a sequential cell determined by the inferrer during translation of the RTL;

Candidate cells—available cells in the library that potentially match the functionality of the requested cell after manipulation such as inhibition, transformation or combinational inference;

Sequential cell server—a tool that generates cells requested by the inferrer by interconnecting the library cells, wherein the server either directly matches a cell from the library to the requested cell or builds the requested cell by manipulating a library cell;

Transformation mechanism—the process by which a candidate cell is converted into a requested cell, including the specific inhibition, transformation and inference operations necessary to apply to a candidate cell to give it the requested functionality;

Inhibition—the manipulation of a candidate cell wherein a given element is replaced by a connection;

Transformation—the manipulation of a candidate cell wherein a given element is changed to another element;

Combinational inference—the manipulation of a candidate cell wherein a given element is added;

Methodology

The invention provides a method for converting identified candidate cells to generate the functionality of a requested cell. The requested cell is converted to a polynomial expression and then divided by the polynomial expression of the candidate cell. The result of the division dictates the necessary inhibition, transformation and inference steps to convert the candidate cell into the requested cell.

As described below, the concepts of polynomial theory may be applied to sequential cells. A polynomial comprises the sum of monoms taken to varying degrees. For example, in the polynomial $P=X^3+4X+7$, X is a monom of degree 3, 1 and 0 respectively. Multinoms are the product of different monoms, all of which have a degree of 1, 0 or −1. A monom may be considered a degenerated multinom. In the set of reals, only 1 is a multinom since $X^0=1$. These principles are demonstrated in the following examples:

$X^1=X$ $X^0=1$ $X^{-1}=1/X$

If X, Y and W are monoms, then

XYW is a multinom,

YW is a multinom,

X is a multinom, $W(X^{-1})$ is a multinom, 1 is a multinom, $(Y^2)W$ is not a multinom, $(X^3)(Y^{-3})$ is not a multinom, and 4 is not a multinom.

Monoms may be further classified as major or minor. Major monoms cannot divide 1, while minor monoms can: $1/X=X^{-1}$.

There are two primary rules that govern division of polynomial expression of sequential cells. First, if Ztype and Zref are multinoms, then Ztype is divisible by Zref if the major monoms of Zref are also present in Ztype. For example:

If S, O, R, Re and T are major monoms, and X, Y and N are minor monoms, then

SOR is divisible by R,

SOR is divisible by OY,

Re is divisible by ReN,

SORXY is not divisible by ReN,

O is not divisible by SOR, and

T is not divisible by RX.

Second, prior to the division, the degree of the multinom is set to 1. Thus:

$((SOR)^3)/(OY)=SOR/OY=SR/Y$ $((SORXY)^3)/(SOR)^2)=SORXY/SOR=XY$

The above rules and definitions regarding polynomials can be applied to sequential data input functions. For a given cell, each element is a multinom having a degree corresponding to the element's position in the cell. Using the major monoms Rst, St, Sc, Re and T and the minor monoms Lr, Ls, Mu and Lre. Accordingly, each element can be described with the following multinoms:

Rst: Reset active high

RstLr: Reset active low

St: Set active high

StLs: Set active low

ScStRst: Scan active high

ScStLsRstLr: Scan active low

MuScStRst: Mux after Scan

Re: Recirculating active high

ReLre: Recirculating active low

T: Toggle

Figure 1:
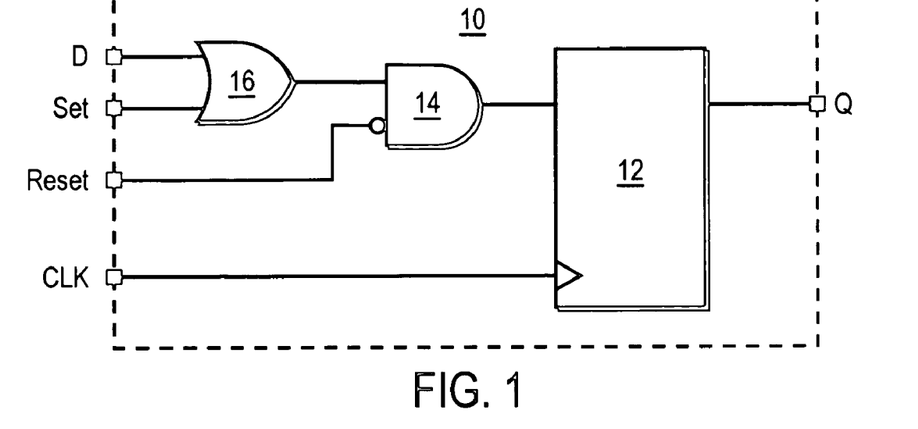
FIG. 1 is a schematic representation of an active high synchronous Set Reset cell.
Figure 2:
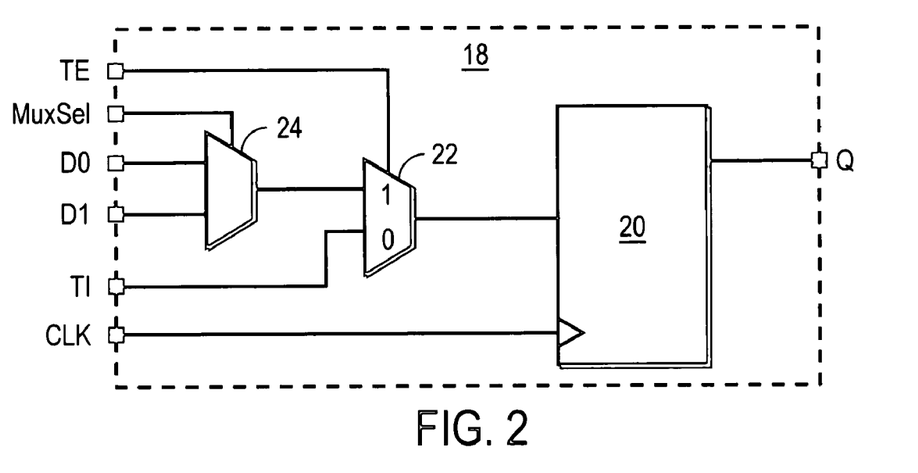
FIG. 2 is a schematic representation of a flipflop with active low ScanMux.
Figure 3:
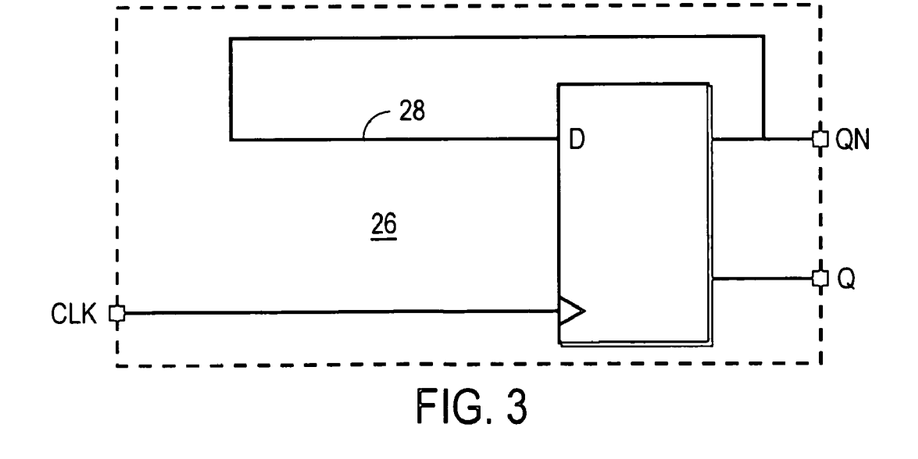
FIG. 3 is a schematic representation of a Toggle flip-flop.

For example, FIG. 1 is a schematic representation of a sequential cell 10 comprising a flipflop 12 with an active high synchronous Reset 14 and Set 16. The Reset 14 is adjacent to the flipflop 12 so it has position (and degree) one. Similarly, the Set 16 element is in position 2. Accordingly, the polynom representing cell 10 is $Rst+St^2$. FIG. 2 is a schematic representation of a ScanMux flipflop active low 18, that is, a flipflop 20 with a Scan active low 22 and a Mux 24, and thus its polynomial representation is $ScStLsRstLr+(MuScStRst)^2$. FIG. 3 is a schematic representation of a Toggle flipflop 26. The Toggle is a wire 28 that loops inverted Q output back to the input. The polynomial for Toggle flipflop 26 is T.

Figure 4:
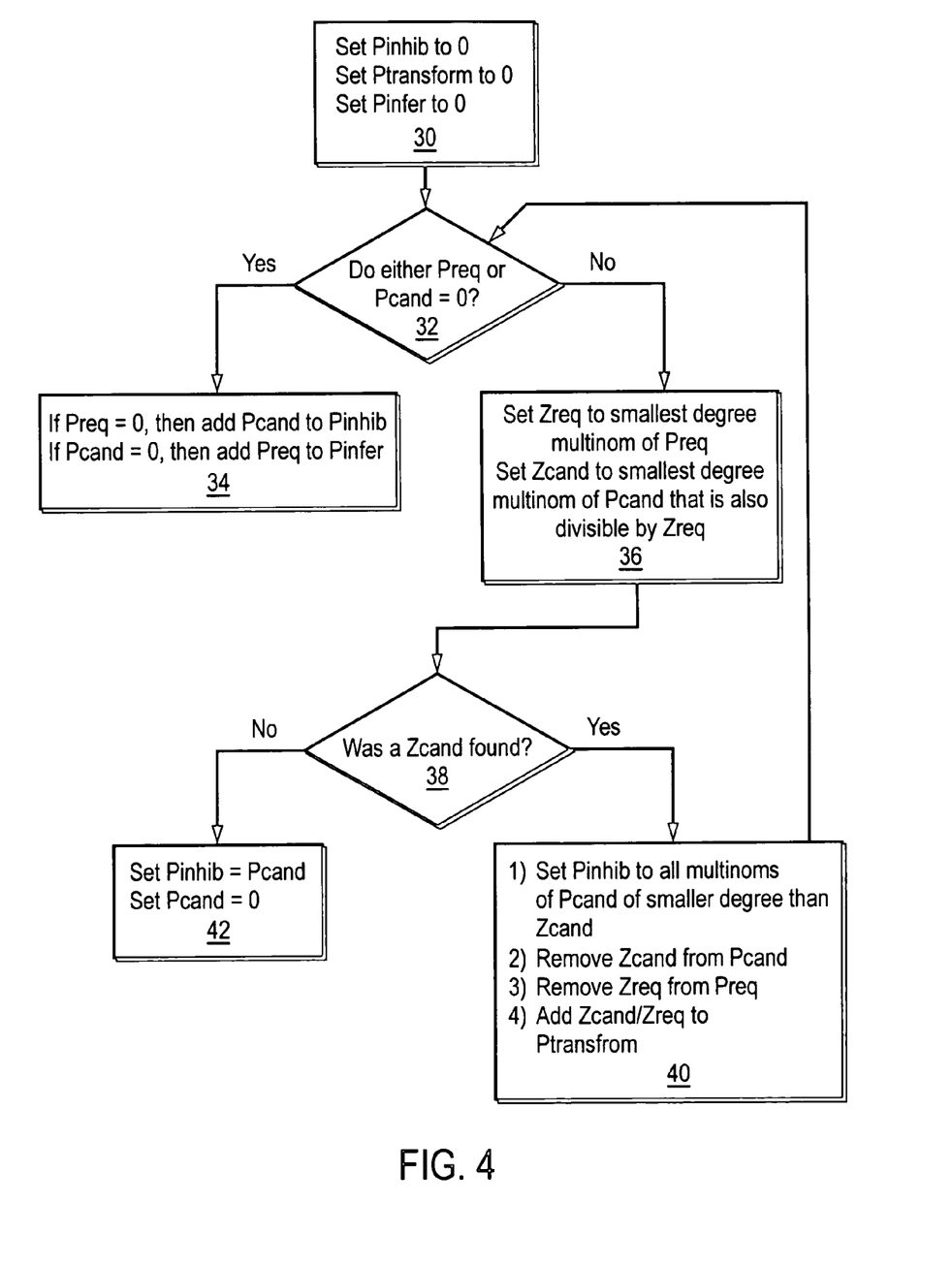
FIG. 4 is a flow chart showing the process of the invention.
Figure 5:
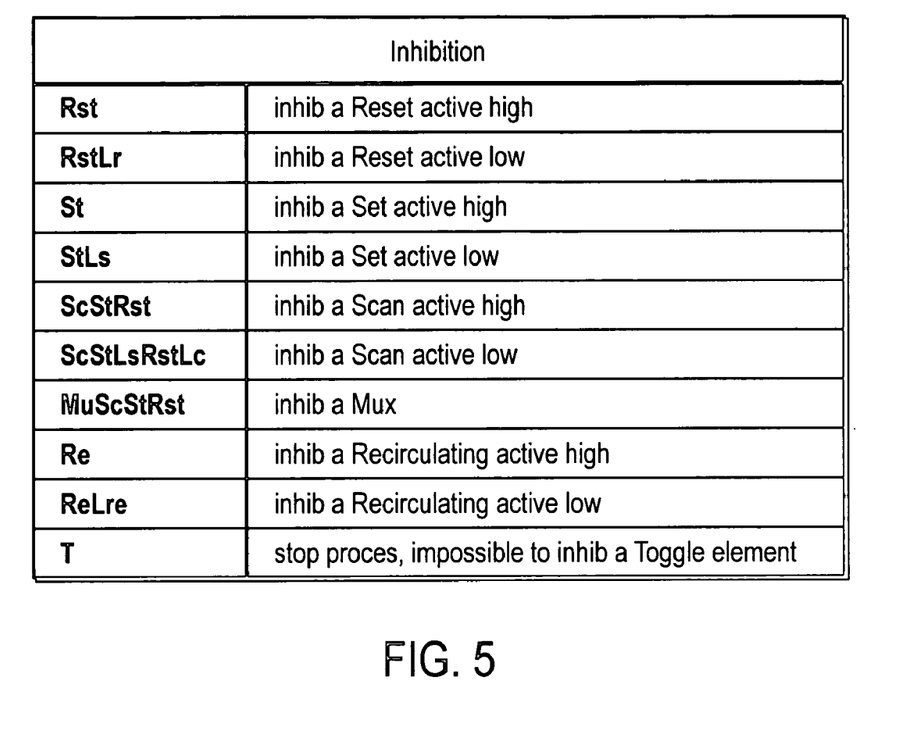
FIG. 5 is a table of Inhibition rules to apply based on the results of the process.
Figure 6:
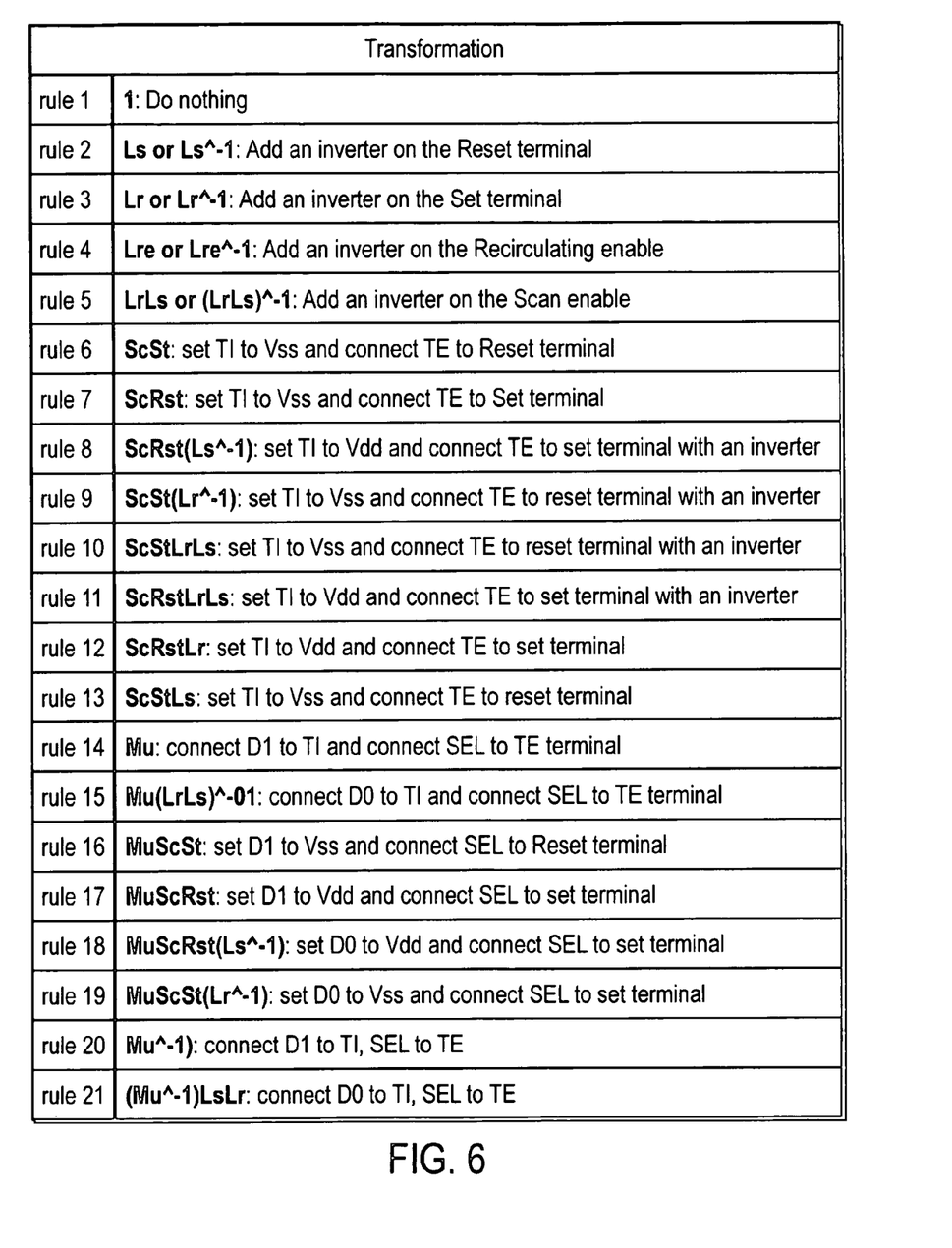
FIG. 6 is a table of Transformation rules to apply based on the results of the process.
Figure 7:
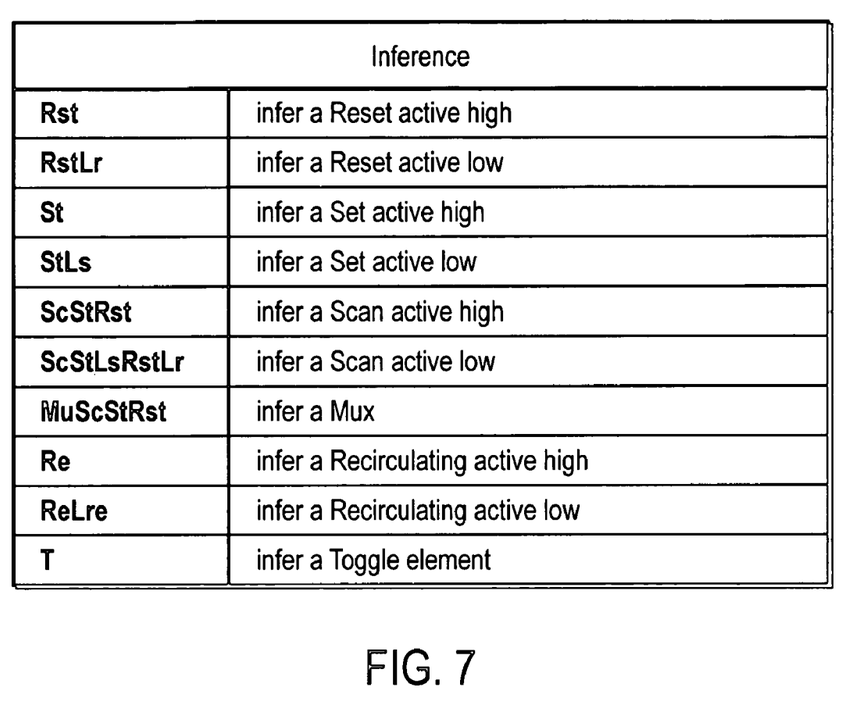
FIG. 7 is a table of Inference rules to apply based on the results of the process.

The transformation process of the invention is summarized in the flowchart shown in FIG. 4. The following abbreviations are used:

Preq is the polynom of the requested cell and Zreq is a multinom portion of Preq;

Pcand is the polynom of the candidate cell and Zcand is a multinom portion of Pcand;

Pinhib is the polynom representing the elements to be inhibited on the candidate cell as detailed in FIG. 5;

Ptransform is the polynom representing the elements to modify by adding an inverter or stocking an input terminal as detailed in FIG. 6; and Pinfer represents the elements to infer on the candidate cell data input terminal as detailed in FIG. 7.

The process begins at step 30, wherein the values of Pinhib, Ptransform and Pinfer are set to 0. Next, in step 32, if either Pcand or Preq is equal to 0, then step 34 is performed. If neither Pcand nor Preq is equal to 0, then step 36 is performed, wherein Zreq is set to equal the multinom of the smallest degree in Preq and Zcand is set to equal the multinom of the smallest degree in Pcand, that is also divisible by Zreq. Step 38 queries whether a suitable Zcand is found, that is, if Pcand has a multinom divisible by Zreq. If so, division subroutine step 40 adds all multinoms of Pcand that are smaller than Zcand to Pinhib, removes Zcand from Pcand, removes Zreq from Preq and adds the result of the Zcand/Zreq division to Ptransform. The process now loops back to step 32 to check whether all the multinoms of Pcand and Preq have been addressed. From step 38, if Pcand does not have a multinom divisible by Zreq, step 42 sets Pinhib equal to Pcand and then sets Pcand to 0. After step 42, the process also loops back to step 38. Step 34 is performed when either Pcand or Preq initially equals 0 or has been reduced to 0 by previous divison subroutine manipulation. In step 34, if Preq equals 0, then Pcand is added to Pinhib and if Pcand=0 then Preq is added to Pinfer.

The division subroutine 40 follows the general rules established above for polynomial division. The Sc, Rst, St, Re and T monoms are major monoms and must be present in Zcand if they are found in Zreq. For example:

ScStRst is divisible by Rst (=ScSt);

ScStRst is divisible by StY (=(ScRst)/Y);

Re is divisble by ReLre (=Lre^-1);

ScStRstLrLs is not divisible by ReLre (Zcand does not have the major monom Re); St is not divisible by ScStRst (Zcand does not have the major monoms Sc and Rst); and T is not divisble by RstLr (Zcand does not have the major monom Rst).

Further, the degree of the multinoms Zreq and Zcand is set to 1 for the division.

For example:

((ScStRst)^3)/(StLs)=ScStRst/StLs=ScRst/Ls.

The process of FIG. 4 returns three polynomials, Pinhib, Ptransform and Pinfer for a given Preq and Pcand. The candidate cell is thus subjected to an inhibition step, a transformation step and an inference step. Together, the inhibition, transformation and inference steps are considered the transformation of the candidate cell into the requested cell. First, for each multinom of Pinhib, the corresponding rule shown in FIG. 5 is applied to the candidate cell. Second, the transformation rule base shown in FIG. 6 is applied as dictated by Ptransform. Finally, the Pinfer multinom determines the elements to add to the candidate cell as shown in FIG. 7. The degrees of the Pinfer multinoms must be conserved so that the multinom of the lowest degree must be inferred first and placed adjacent the flipflop or latch. In other words, as described above, the degree of the Zcand and Zreq leading to the Pinfer will determine where the inferred element belongs in the latch in relation to any other elements.

Figure 8:
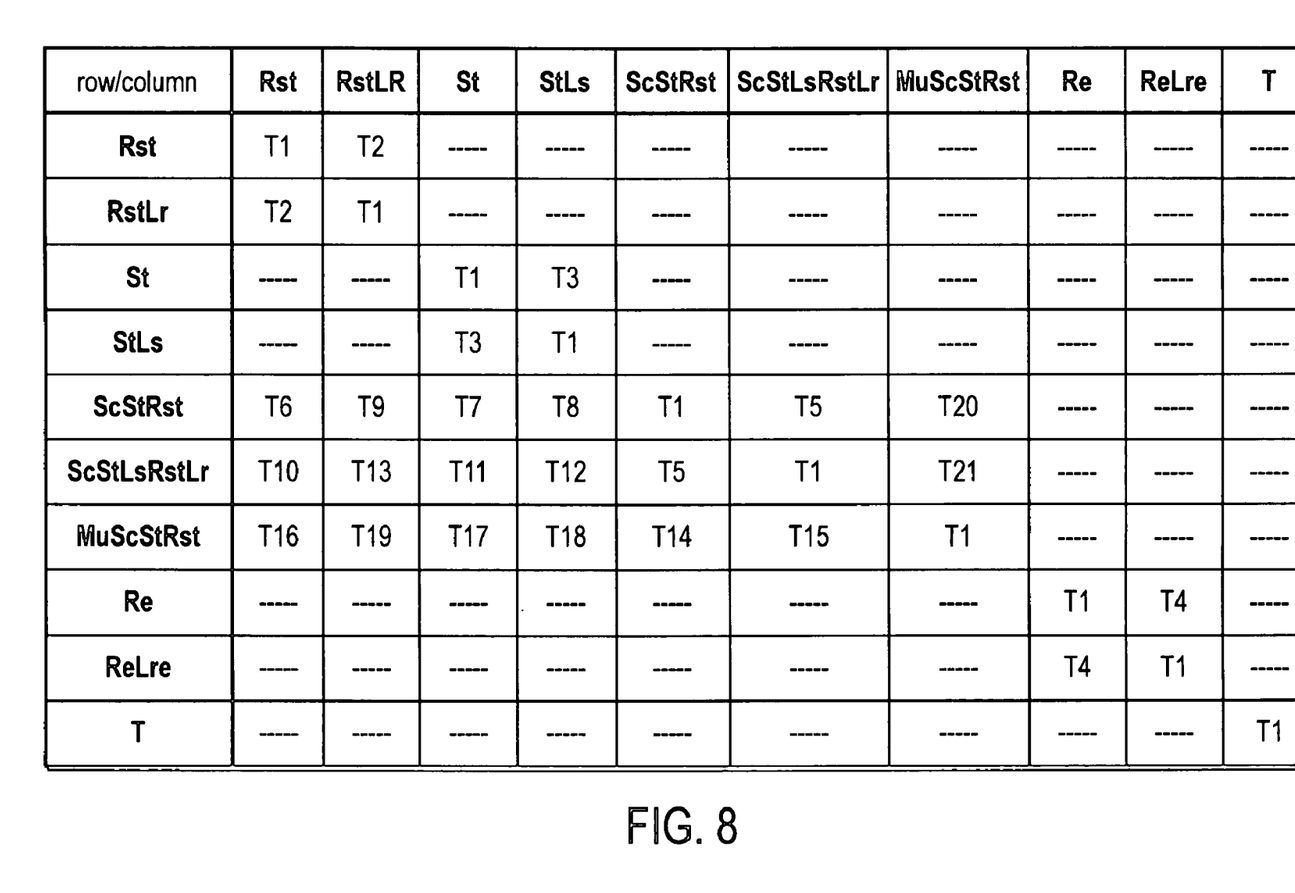
FIG. 8 is table showing the possible combinations of multinom divisions.

FIG. 8 is a table illustrating all the possible combinations of the multinom divisions discussed above. The columns are the divisor while the rows are the dividends. The table demonstrates that the transformation rule base shown in FIG. 6 accommodates all the possible division results. Accordingly, the inventive process offers significant advantages over prior art full rule based transformation logic synthesis. In the above examples, only 41 rules are necessary to perform all the transformation for all combinations of candidate cells and requested cells. In contrast, the prior art rule based systems require 470,596 rules for a comparable process. Thus, the inventive system is significantly more efficient. As a practical matter, a greater number of candidate cells can be generated due to the more efficient transformation, allowing greater flexibility in optimizing the netlist for area, power consumption, routing issues and the like.

EXAMPLES

Figure 9:
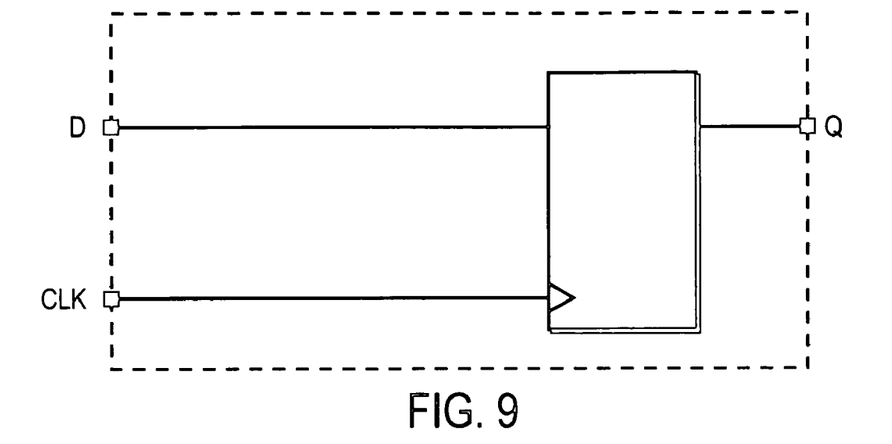
FIG. 9 is a schematic representation of a D input flipflop candidate cell.

For the first example, the requested cell is an active high Reset Set flip-flop as shown in FIG. 1. The process of the invention may be compared to the prior art example discussed above in the background. The polynomial representation is Preq=Rst+St^2. If the candidate cell is a simple D flipflop, shown in FIG. 9, then Pcand=0. Step 32 thus leads directly to step 34 where, since Pcand=0, Preq is added to Pinfer. Pinhib and Ptransform maintain their starting values of 0. Accordingly, nothing is inhibited or transformed and Rst+St^2 is inferred. Since the Rst multinom has the lowest degree, it is placed in the first position and the Set element is placed in the second position.

Figure 10:
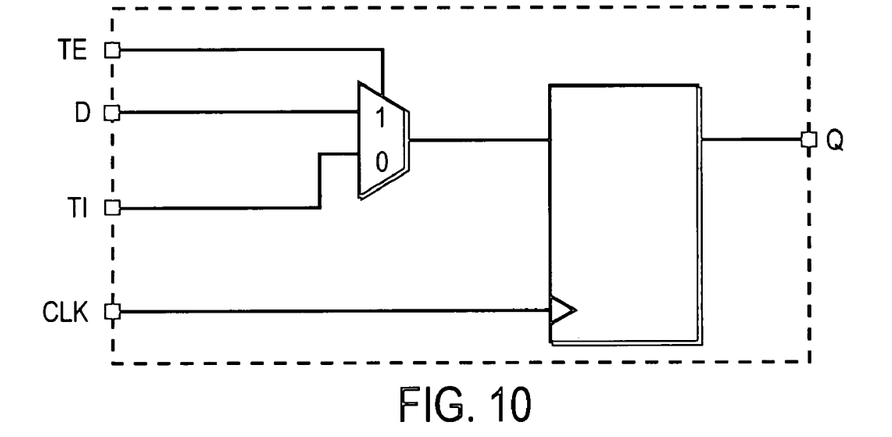
FIG. 10 is a schematic representation of an active low Scan flip-flop candidate cell.

Alternatively, if the candidate cell is an active low scan flipflop as shown in FIG. 10, Pcand=ScStLsRstLr. The process is followed to step 36 where Zreq is set to Rst and Zcand is set to ScStLsRstLr. Zcand is divisible by Zreq, so step 40 sets Pinhib to the Pcand multinoms of smaller degree than Zcand, here 0. Step 40 further subtracts Zcand from Pcand, thus setting Pcand to 0, subtracts Zreq from Preq, thus setting Preq to St^2, and sets Ptransform to Zcand/Zreq, i.e. ScStLsLr. The process is then looped back to step 32, where the Pcand value of 0 then routes the process to step 34. Since Pcand is 0, Pinfer is set to Preq which now has the value of St^2. Thus, the result of the process is Pinhib=0, Ptransform=ScStLsLr and Pinfer=St^2. From FIGS. 5–7, the corresponding operations performed on the candidate cell is to inhibit nothing, set TI to Vss and connect TE to the Reset terminal with an inverter (converting the Scan element to a Reset element with the correct polarity) and infer a Set.

Figure 11:
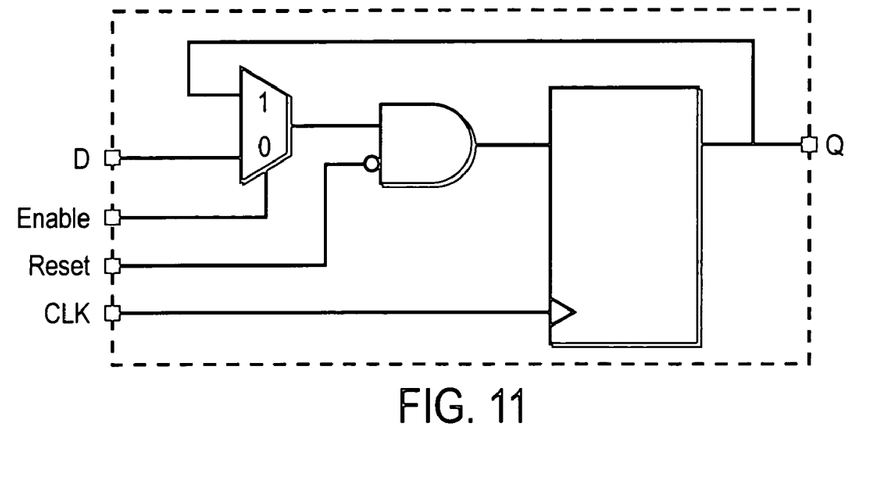
FIG. 11 is a schematic representation on an active high Reset active high Recirculating candidate cell.

For the final example, the candidate cell is a flipflop with an active high Reset and an active high Recirculating as shown in FIG. 11. Thus, Preq is still Rst+St^2 and Pcand is Rst+Re^2. Step 36 sets Zreq to Rst and Zcand to Rst. Since the division is possible, step 40 adds 0 to Pinhib as there are no multinoms of smaller degree in Pcand. Next, Rst is subtracted from Pcand leaving Re^2 and Rst is subtracted from Preq leaving St^2. Finally, Ptransform is given a value of 1, for the value of Zreq/Zcand. The process is looped back to step 32 and then to 36 as neither Pcand nor Preq is 0 yet. At step 36, Zreq is set to St^2 and Zcand is set to Re^2. Step 38 routes the process to step 42 as Zcand is not divisible by Zreq. Then Pcand (Re^2) is added to Pinhib and Pcand is set to 0. The process is looped back to step 32 and then to 34. Since Pcand is now 0, Preq is added to Pinfer giving it a value of St^2. Thus, Pinhib has the value Re^2, Ptransform has the value 1 and Pinfer has the value St^2. Thus, from FIGS. 5–7, the Recirculating active high is inhibited, nothing is transformed and a Set is inferred.

The inventive process can be easily adapted to accommodate additional elements. A dedicated multinom is added for the new element and a few additional rules are added to the inhibition, transformation and inference rule bases. The process remains unchanged. For example, a JK element can be incorporated by adding only 10 extra rules to the inhibition, transformation and inference rule bases. In contrast, inclusion of a JK element in the prior art rule based approach would multiply the number of required rules by a factor of four. Further, the process can be optimized if necessary. Certain elements can be further described by additional monoms. For example, a monom can be used to indicate that a Scan element is in the last position, allowing it to be considered a Mux.

Described herein is a preferred embodiment, however, one skilled in the art that pertains to the present invention will understand that there are equivalent alternative embodiments.

What is claimed is:

1. A method for inferring a requested sequential cell from a candidate cell, comprising the steps of:
   a) representing the requested cell as a mathematical expression;
   b) representing the candidate cell as a mathematical expression;
   c) performing an operation on the requested cell representation with the candidate cell representation to return at least one value;
   d) providing a rule corresponding to each returned value;
   e) transforming the candidate cell into the requested cell by performing each rule corresponding to each returned value; and
   f) generating a netlist using the transformed candidate cell;
   wherein the operation performed comprises dividing the polynomial representation of the candidate cell with the polynomial representation of the requested cell.

2. The method of claim 1, wherein the mathematical representations of the candidate cell and the requested cell are polynoms.

3. The method of claim 1, wherein the polynoms comprise one or more multinoms corresponding to logical elements.

4. The method of claim 3, wherein the multinoms are selected from the group consisting of Rst, Lr, St, Ls, Sc, Mu, Re, Lre and T.

5. The method of claim 1, wherein the step of dividing the polynomial representations returns at least one multinom corresponding to necessary inhibitions, transformations and inferences.

6. The method of claim 1, wherein the steps are implemented by a computer.

7. A method for inferring a requested sequential cell from a candidate cell, comprising the steps of
   a) representing the requested cell as a Preq polynom having a multinom of smallest degree;
   b) representing the candidate cell as a Pcand polynom;
   c) if neither Preq nor Pcand equals zero, setting a multinom Zreq equal to the multinom of smallest degree of Preq, and if either Preq or Pcand equals zero, performing step f);
   d) determining whether Pcand comprises multinoms divisible by Zreq and if so, setting Zcand equal to the smallest degree multinoms of Pcand divisible by Zreq, otherwise setting a polynom Pinhib equal to Pcand, then setting Pcand equal to zero and performing step c);
   e) adding to Pinhib multinoms of Pcand having smaller degree than Zcand, subtracting Zcand from Pcand, subtracting Zreq from Preq, adding the polynom quotient of Zcand divided by Zreq to a polynom Ptransform, and then performing step c);
   f) if Preq equals zero, then adding Pcand to Pinhib and if Pcand equals zero, then adding Preq to a polynom Pinfer and
   g) generating a netlist using the candidate cell.

8. The method of claim 7, wherein the polynoms Pinhib, Ptransfer and Pinfer comprise multinoms, further comprising the steps of providing rules corresponding the multinoms of Pinhib, Ptransfer and Pinfer and applying the rules to the candidate cell to transform the candidate cell into the requested cell.

9. The method of claim 8, wherein the polynoms Pcand and Preq and the multinoms Zcand and Zreq comprise major and minor multinoms and step d) further comprises determining whether any major multinoms present in Zreq are also present in Pcand.

10. The method of claim 9, wherein the multinoms Zreq and Zcand have a degree and the polynom quotient is obtained by setting the degree of Zreq and Zcand to 1 and then dividing Zcand with Zreq.

11. The method of claim 7, wherein the steps are performed by a computer.

12. The method of claim 7, wherein requested cell comprises a flip-flop having a first synchronous function element in a first position and the step of representing a requested cell by a Preq polynom comprises setting Preq equal to a multinom corresponding to the first element and giving the multinom a degree of one.

13. The method of claim 12, wherein the requested cell comprises a second function element in a position and the step of representing a requested cell by a Preq polynom comprises summing the multinom corresponding to the first element with a multinom corresponding to the second element, wherein the second element multinom has a degree corresponding to the second element position.

14. A system for inferring a requested sequential cell from a candidate cell during the generation of a netlist; the system comprising:
   a) means for representing the requested cell as a mathematical expression;
   b) means for representing the candidate cell as a mathematical expression;
   c) means for performing an operation on the requested cell representation with the candidate cell representation to return at least one value;
   d) means for providing a rule corresponding to each returned value; and
   e) means for transforming the candidate cell into the requested cell by performing each rule corresponding to each returned value;
   wherein the operation performed comprises dividing the polynomial representation of the candidate cell with the polynomial representation of the requested cell.

15. The system of claim 14, wherein the mathematical representations of the candidate cell and the requested cell are polynoms.

16. The system of claim 14, wherein the polynoms comprise one or more multinoms corresponding to logical elements.

17. The system of claim 16, wherein the multinoms are selected from the group consisting of Rst, Lr, St, Ls, Sc, Mu, Re, Lre and T.

18. The system of claim 15, wherein the means for dividing the polynomial representations returns at least one multinom corresponding to necessary inhibitions, transformations and inferences.

19. The system of claim 14, wherein the means are implemented by a computer.

20. A system for inferring a requested sequential cell from a candidate cell during the generation of a netlist; comprising:
   a) means for representing the requested cell as a Preq polynom having a multinom of smallest degree;
   b) means for representing the candidate cell as a Pcand polynom;
   c) means for setting, if neither Preq nor Pcand equals zero, a multinom Zreq equal to the multinom of smallest degree of Preq, and if either Preq or Pcand equals zero, initiating the function of f);

d) means for determining whether Pcand comprises multinoms divisible by Zreq and if so, setting Zcand equal to the smallest degree multinoms of Pcand divisible by Zreq, otherwise setting a polynom Pinhib equal to Pcand, then setting Pcand equal to zero and performing step c);

e) means for adding to Pinhib multinoms of Pcand having smaller degree than Zcand, subtracting Zcand from Pcand, subtracting Zreq from Preq, adding the polynom quotient of Zcand divided by Zreq to a polynom Ptransform, and then initiating the function of means c); and f) means for adding, if Preq equals zero, Pcand to Pinhib and if Pcand equals zero, then adding Preq to a polynom Pinfer.

21. The system of claim 20, wherein the polynoms Pinhib, Ptransfer and Pinfer comprise multinoms, further comprising means for providing rules corresponding the multinoms of Pinhib, Ptransfer and Pinfer and applying the rules to the candidate cell to transform the candidate cell into the requested cell.

22. The system of claim 21, wherein the polynoms Pcand and Preq and the multinoms Zcand and Zreq comprise major and minor multinoms and means d) further comprises means for determining whether any major multinoms present in Zreq are also present in Pcand.

23. The system of claim 22, wherein the multinoms Zreq and Zcand have a degree and the polynom quotient is obtained by setting the degree of Zreq and Zcand to 1 and then dividing Zcand with Zreq.

24. The system of claim 20, wherein the means are implemented by a computer.

25. The system of claim 20, wherein the requested cell comprises a flip-flop having a first synchronous function element in a first position and the means for representing a requested cell by a Preq polynom comprises means for setting Preq equal to a multinom corresponding to the first element and giving the multinom a degree of one.

26. The system of claim 25, wherein the requested cell comprises a second function element in a position and the means for representing a requested cell by a Preq polynom comprises means for summing the multinom corresponding to the first element with a multinom corresponding to the second element, wherein the second element multinom has a degree corresponding to the second element position.

27. The method according to claim 1, wherein:
said method is embodied in a set of computer instructions stored on a computer readable media; and
said computer instructions, when loaded into a computer, cause the computer to perform the steps of said method.

28. The system according to claim 14, wherein each of said means comprise software components.

* * * * *